(12) United States Patent
Kaur et al.

(10) Patent No.: US 11,177,803 B2
(45) Date of Patent: Nov. 16, 2021

(54) THRESHOLD TRACKING POWER-ON-RESET CIRCUIT

(71) Applicant: TEXAS INSTRUMENTS INCORPORATED, Dallas, TX (US)

(72) Inventors: Divya Kaur, Delhi (IN); Rajat Chauhan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/038,100

(22) Filed: Sep. 30, 2020

(65) Prior Publication Data
US 2021/0184671 A1 Jun. 17, 2021

(30) Foreign Application Priority Data

Dec. 12, 2019 (IN) .............................. 201941051507

(51) Int. Cl.
*H03K 17/22* (2006.01)
(52) U.S. Cl.
CPC .................................. *H03K 17/223* (2013.01)
(58) Field of Classification Search
None
See application file for complete search history.

(56) References Cited

U.S. PATENT DOCUMENTS

| | | | |
|---|---|---|---|
| 4,812,679 A | 3/1989 | Mahabadi | |
| 6,914,461 B2 * | 7/2005 | Kwon | H03K 17/223 327/143 |
| 8,754,679 B2 * | 6/2014 | Sanborn | H03K 17/223 327/143 |
| 9,143,137 B2 | 9/2015 | Gonzalez | |
| 2015/0102672 A1 | 4/2015 | Matsumoto et al. | |
| 2015/0349637 A1 | 12/2015 | Lu et al. | |
| 2017/0111039 A1 | 4/2017 | Akour et al. | |

OTHER PUBLICATIONS

Zhang, Chao et al. "A CMOS Hysteresis Undervoltage Lockout with Current Source Inverter Structure." IEEE. 2011.
Fuhua, Li et al. "Design of a Under Voltage Lock Out Circuit with Bandgap Structure." ISIC 2009.
Search Report for PCT Patent Application No. PCT/US2020/064786, date of mailing of the international search report dated Apr. 1, 2021, 1 page.

* cited by examiner

*Primary Examiner* — Jeffery S Zweizig
(74) *Attorney, Agent, or Firm* — Michael A. Davis, Jr.; Charles A. Brill; Frank D. Cimino

(57) ABSTRACT

A power-on-reset (POR) circuit includes an NFET branch and a PFET branch. The NFET branch includes: an n-channel field effect transistor (NFET) having a first threshold voltage; and a first quiescent bias current source coupled between a supply terminal and the NFET. The PFET branch includes: a p-channel field effect transistor (PFET) having a second threshold voltage; and a second quiescent bias current source coupled between a ground terminal and the PFET. The POR circuit is configured to provide a POR signal at an output terminal based on: the first threshold voltage or the second threshold voltage, whichever is larger; and a voltage margin. The output terminal is coupled between the PFET branch and the second quiescent bias current source.

23 Claims, 8 Drawing Sheets

THRESHOLD TRACKING POWER-ON-RESET CIRCUIT

CROSS-REFERENCE TO RELATED APPLICATION

This application claims the benefit of and priority to Indian Patent Application No. 201941051507, filed Dec. 12, 2019, entitled "nA Iq, FAST RESPONSE, OPTIMAL THRESHOLD TRACKING POWER-ON-RESET CIRCUIT", which is hereby incorporated herein by reference in its entirety.

BACKGROUND

Example power-on-reset (POR) circuits help to ensure a proper power level for integrated circuits, digital circuitry or other devices in a power-up state, a power-down state or an interrupt state. Accordingly, an example POR circuit operates at power transitions between a reset state (in which the POR circuit actively operates) and an active state, remaining in a general active mode of operate. The POR is high when VDD is higher than a required level and low when video is lower. For example, in the power-up (or start-up) state, the example POR circuit transitions from its reset state to its active state when the supplied power (VDD) has risen enough to support stable operation of a device whose digital circuitry is set to a proper state of operation. In the power-down state, the example POR circuit transitions from its active state to its reset state when the supplied power (VDD) has dropped below a safe voltage (e.g., if register or flip-values are reset to a default state or logic state zero). To operate optimally, the example POR circuit tracks the lowest quiescent current (Iq), within a nanoamp range, and operates at a low working supply voltage for the device with fastest trip delay.

SUMMARY

A power-on-reset (POR) circuit includes an NFET branch and a PFET branch. The NFET branch includes: an n-channel field effect transistor (NFET) having a first threshold voltage; and a first quiescent bias current source coupled between a supply terminal and the NFET. The PFET branch includes: a p-channel field effect transistor (PFET) having a second threshold voltage; and a second quiescent bias current source coupled between a ground terminal and the PFET. The POR circuit is configured to provide a POR signal at an output terminal based on: the first threshold voltage or the second threshold voltage, whichever is larger; and a voltage margin. The output terminal is coupled between the PFET branch and the second quiescent bias current source.

DETAILED DESCRIPTION

The drawings herein are not necessarily drawn to scale.

A power-on-reset circuit (POR) is useful for devices that have digital circuitry, in order to ensure that proper voltage is available during startup before such voltage is provided to the digital circuitry at a POR output. POR circuits described herein are configurable to accommodate and overcome various challenges with an optimal trip point, while operating at a quiescent nanoamp range. The trip point can ensure a proper supply for resetting a digital device that is set to track maximum p-channel field effect transistor (PFET) and n-channel field effect transistor (NFET) threshold voltages plus a voltage margin. The value of the margin can be added and determined based on allowable delays or a frequency of operation of the digital device, or other parameters. For example, the voltage margin can be a tunable voltage margin that is configured based on at least one of: a temperature variable, a frequency of operation, or an overdrive voltage of the NFETs and PFETs of the POR, while the threshold voltage that the POR tracks includes a maximum threshold voltage of transistors therein.

The POR circuit can include a complementary metal oxide semiconductor (CMOS) logic circuit including an NFET branch and a PFET branch. The NFET branch includes NFETs coupled together in series, and the PFET branch includes PFETs coupled to the NFET branch via a supply input. A supply coupled to the NFET branch and the PFET branch of the CMOS logic circuit can be configured to provide a nanoamp quiescent bias to the CMOS logic circuit. The CMOS logic circuit is configured to ensure an initialization of an integrated circuit (IC) (coupled to a POR output of the CMOS logic circuit) with a POR output signal at an operational power-down or power-up of the IC based on a POR trip point variation. The POR trip point variation as a trip point voltage margin (vTRIP) is based on a tunable voltage margin (Vmargin) and a threshold voltage (VTH) of the at least one NFET (VTH_NFET) and the at least one PFET (VTH_PFET), so vTRIP is a function of maximum threshold voltage (VTH_NFET, VTH_PFET) plus the Vmargin. Additional aspects and details of this description are further described below with reference to the drawings.

Figure 1:
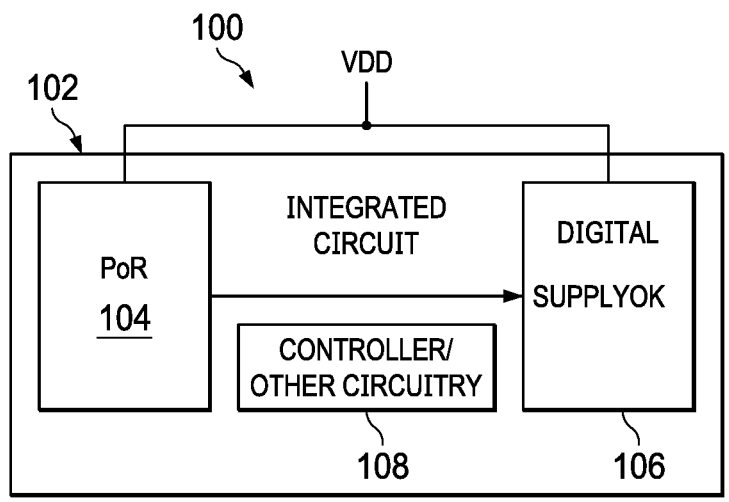
FIG. 1 is a block diagram of a power-on-reset (POR) system/device according to various aspects (embodiments) of this description.

FIG. 1 is a block diagram of a system 100 whose integrated circuit (IC) 102 includes a POR circuit 104, a digital device or circuitry 106, and a controller or other circuitry 108. The POR 104 can provide a power-on reset for one or more IC components of the digital device 106. Power (VDD) can be provided to the POR circuit 104 and the digital device 106 via the IC 102.

For nanoamp (nA) quiescent current (Iq), which are low supply voltage circuits, the existing POR topologies pose various challenges. For example, as the bias currents fall to the nA level, the POR trip delay increases by a large amount, which can pose a critical challenge in ICs that require a fast start up (<500 microseconds). For KHz-MHz operation, CMOS digital logic can operate optimally when the supply is higher than at least a maximum of the worst case FET threshold voltage plus an overdrive voltage. Existing architectures demanding low area and fast response time are not necessarily always able to track the maximum threshold voltage (Vth) of both PFET and NFET while operating at a nanoamp (nA) quiescent current (Iq). For nanoamp circuits, very long length transistors are used because transistors are usually in a subthreshold operation region, usually to extract an overdrive voltage (Vgs) in proximity of the threshold Vth with a nA bias, but that approach may cause bad transient performance or a long trip point delay before the POR 104 is able to provide a POR output signal (e.g., supply OK signal). Circuits having a fixed threshold with certain accuracy can effectively operate with a minimum supply voltage at least equal to the worst threshold voltage (higher of PFET and NFET) plus a margin based on the desired speed along with the worst-case trip point variation. Accordingly, it places a limit on the VDDmin that the circuit can reliably turn on.

The digital device 106 can be any component or device whose digital circuitry is configured to reset or initialize during start up or transitions in power, to ensure proper functioning. For example, the digital device 106 can include one or more flip-flops, latches, registers or other components of a digital circuit that the POR operates for providing a digital reset signal or supply OK signal based on a threshold voltage of CMOS logic, including NFETs and PFETs and a variable voltage margin. In at least one example, the digital device 106 can be operable up to about 1.2 Volts, where POR circuit(s) 104 can be configured to track a lowest operable voltage of the digital device 106. The threshold voltage of the POR circuit 104 can track this operation level. A lowest operating voltage of the POR device 104 can be configured according to various factors. For example, the threshold voltage of the transistor(s) (e.g., PFET and NFET stacks) can be one such factor. The voltage supply may be equal to or above the maximum threshold voltage of these transistors and a voltage margin.

For example, CMOS logic includes NFETs and PFETs, and the operating voltage can be configured to be higher than the maximum threshold voltage of these two stacks of transistors for the device 106 to power effectively. Also, another factor includes a certain overdrive Vgs. An overdrive voltage margin for the digital circuit 106 can contribute to the POR trip point once the POR output is asserted. POR configurations for the embodiments herein achieve an optimum minimum voltage in a quiescent current (Iq) at which the circuit can operate to ensure the current consumption is nanoamps (or the power consumption is nanowatts), and also be ready to respond or transition rapidly for the digital device 106 by tracking the maximum threshold voltage of the PFET or NFET stacks plus an added voltage margin.

A nanoamp quiescent current of the POR 104 can operate the device as a parameter for low-power, energy-efficient operation. In at least one example, the quiescent current is a current drawn by the POR 104 in a no-load and non-switching (yet enabled) condition, so current is not necessarily leaving the POR 104. However, the POR 104 is operational with switches turned on, in order to make a voltage available. The digital device can be turned off when the input supply is not proper. The POR 104 ensures that an input supply level is good, so the digital circuitry of the digital device 106 is turned off, and the output is proper during this time. For example, if a supply is not sufficient enough for the circuit 106 to properly function, then the output could be faulty, especially with registers or flip-flop components of the digital device 106, where the components should be initialized and ready for a next operation.

Also, for example, in the IC 102, the POR 104's supply OK signal can be the first signal to initialize the entire IC 102. Accordingly, the POR circuit/device 104 can effectively initialize or power-up the digital circuitry. Thus, the POR circuit 104 can consume very low quiescent current (Iq), preferably in a nanoamp range, and should be configured to track the lowest working supply voltage for the digital device 106.

In an embodiment, the POR device 104 can operate with bias currents at the nanoamp level, and the POR trip delay can operate quickly (e.g., less than 50 microseconds) in ICs 102 that use a fast start up for digital circuitry 106. For KHz-MHz operation, CMOS digital logic of the POR 104 can operate optimally when the supply terminal VDD's voltage is higher than at least a maximum of the worst case FET threshold voltage (the highest threshold voltage among the FETs) from among the transistors of the CMOS digital logic of the POR 104. Accordingly, the POR 104 can be configured to track the maximum threshold voltage (Vth) of both PFET and NFET while operating at a nanoamp (nA) quiescent current (Iq) and to have trip point variation. The POR 104 can be configured to operate according to, based on, or as a function of a maximum threshold voltage of the NFET stack or the PFET stack of transistors plus an added voltage margin. The added voltage margin can be based on allowable delays or a frequency of operation of the digital device.

Alternatively or additionally, the voltage margin can be configured based on at least one of: a temperature variable, a frequency of operation, or an overdrive voltage. The POR tracks the threshold voltage that includes a maximum threshold voltage of transistors therein. Thus, the POR trip point variation (vTRIP) can be based on a tunable voltage margin (Vmargin) and a threshold voltage (VTH) of the NFET stack (VTH_NFET) or the PFET stack (VTH_PFET), so vTRIP is a function of maximum threshold voltage (VTH_NFET, VTH_PFET) plus the Vmargin. This enables the tracking of the threshold voltages by the POR to vary while tracking a fixed threshold voltage for optimal operation.

In nA level circuits, long length transistors may be used for extracting the threshold voltage, because the POR transistors are usually in a subthreshold region to extract Vgs~Vth (as Vgs can be greater than Vth in a subthreshold region) with nA bias, but that approach can result in bad transient performance. For example, if the current is small (e.g., nanoamps), then the POR device 104 can turn on at a subthreshold operation region, even though the threshold voltage is not reached. Preferably, the POR device 104 turns on or provides the supply OK signal when the threshold voltage is crossed. But in very low currents (e.g., nanoamps), the FETs (PFETs, NFETs) may start to turn on even before the threshold voltage has been reached. To ensure that does not happen, a very long or weak transistor is used, so it turns on only after sufficient overdrive (Vgs). However, long length transistors pose challenges for area or device space. As the area increases, the POR trip delay increases, the parasitic capacitances increase, and the delay increases. To remedy those issues, the POR circuit 104 does not necessarily have a fixed constant voltage in operation, but instead tracks the maximum of the respective PFET and NFET threshold voltages (or the maximum of the respective PFET stack and NFET stack threshold voltages), along with a voltage margin that can vary or be tunable. Accordingly, the POR circuit 104 can have a minimum supply voltage or a fixed threshold voltage that accounts for the worst-case threshold that can be reached, with an extra voltage margin to account for an increased speed. Alternatively or additionally, the voltage margin (Vmargin) can be a fixed constant voltage to ensure a maximum of the PFET or NFET threshold voltages is available. The value of the Vmargin can be based on a frequency of operation. For example, a POR circuit with a fast POR response can have a higher voltage margin to ensure the digital circuit 106 (which is turned on at the POR output signal) can have a fast frequency of operation.

Figure 2:
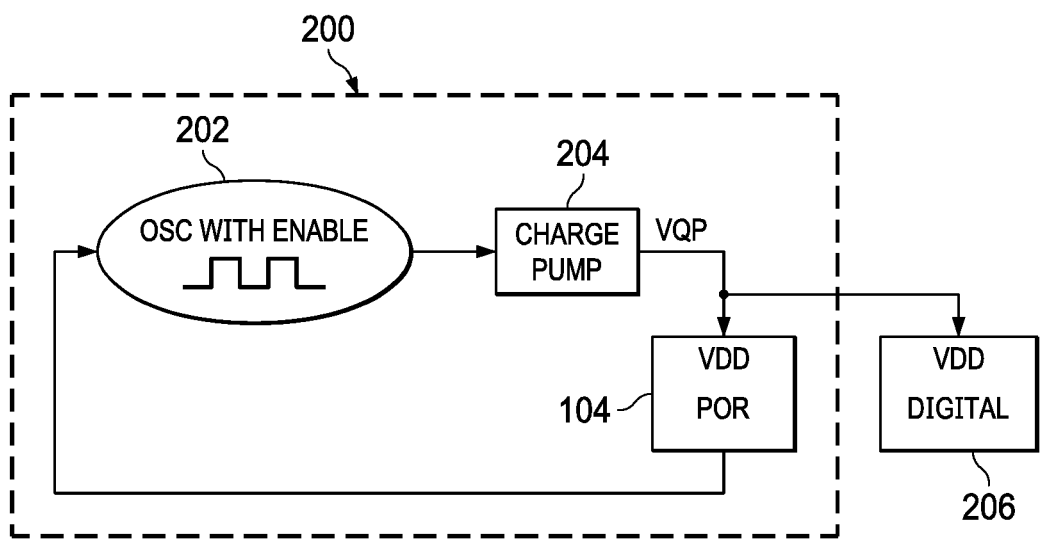
FIG. 2 is an example implementation of a POR system according to various aspects of this description.

FIG. 2 is another example integrated circuit system 200 including the POR device 104. The integrated circuit system 200 includes a charge pump circuit 204 configured to receive a power-on reset signal from the POR device 104. The power-on reset signal enables initialization of the charge pump circuit 204 components when in a reset state, or when being powered up until the charge pump circuit 204 is fully operational. The charge pump circuit 204 provides a charge pump voltage (VQP) as a supply voltage (VDD) to the POR device 104 and the digital device 206.

Figure 3:
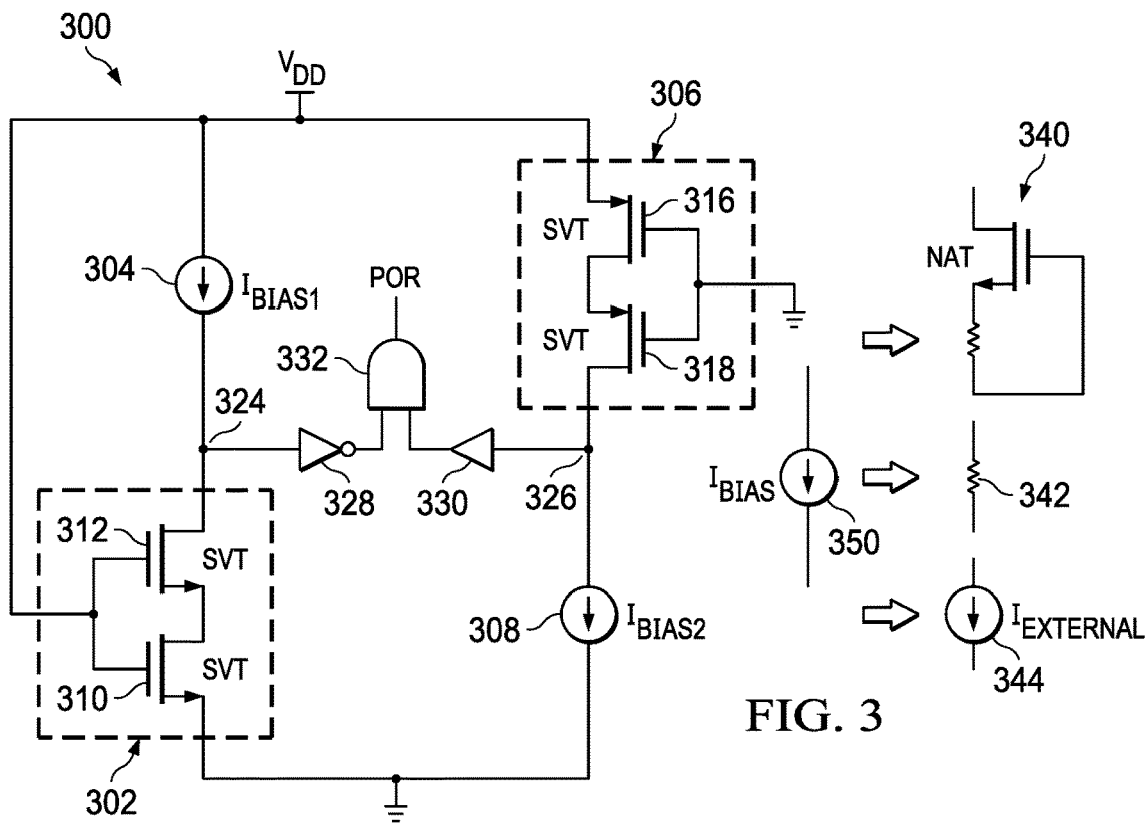
FIG. 3 is an example circuit configuration of a POR device according to various aspects of this description.

FIG. 3 shows a POR device 300, which is an example configuration of the POR device 104. The POR device 300 includes CMOS circuitry having: (a) an NFET branch including an NFET stack 302 and a current source 304; and (b) a PFET branch including a PFET stack 306 and a current source 308. The NFET branch includes an NFET branch node 324, and the PFET branch includes a PFET branch node 326. The NFET and PFET branches are coupled between a supply terminal VDD and a ground terminal. The POR circuit 300 operates at a quiescent current in a nanoamp range. Responsive to the supply terminal VDD satisfying the maximum threshold voltage of each branch, nodes 324 and 326 provide signals via an inverter 328 and a buffer 330, respectively, to a logic device 332 (e.g., logic AND gate) for providing a supply OK signal or power on reset signal at a POR output.

The current source 304 and the current source 308 provide an Ibias1 and Ibias2, respectively. The current sources 304 and 308 can include respective self-starting degenerated natural (NAT) NFETs or respective depletion mode NFETs 340 coupled to a respective one or more resistors. Alternatively or additionally, the current sources 304 or 308 can include a resistor 342, or an external current source 344. Further, the Ibias1, Ibias2 . . . IbiasN, etc. in this description can represent any one or more of the example Ibias structures 350.

For example, an NFET stack 302 can include NFETs 310 and 312 coupled in series to an NFET branch node 324 and the current source 304, together forming an NFET branch of the POR circuit 104 (e.g., 300). Also, for example, a PFET stack 306 can include PFETs 316 and 318 coupled in series to a PFET branch node 326 and the current source 308, together forming a PFET branch of the POR circuit 104 (e.g., 300). In one example, the transistors 310, 312, 316 and 318 can have standard threshold voltage. The supply terminal VDD is connected to the gates of NFETs 310 and 312, and to a source of PFET 316. The gates of PFETS 316 and 318 are connected to the ground terminal.

The POR circuit 104 (e.g., 300) includes CMOS circuitry formed by the circuits shown in FIG. 3, which are configured to operate within a quiescent nanoamp bias range to provide a POR output based on a trip point variation. The trip point variation tracks a maximum threshold voltage of the PFET and the NFET, plus an additional voltage margin.

At the PFET branch, when the supply voltage at the source of the PFET stack 306 rises above the PFET threshold voltage of the PFET stack 306, a voltage at the PFET branch node 326 has a logic high state and tracks the PFET stack threshold voltage. The source of the PFET stack 306 (i.e., the source of PFET 316) has a higher voltage than the gates thereof by at least the PFET stack threshold voltage. The gates of the PFETs 316 and 318 are grounded, so overdrive Vgs of the PFET stack 306 is similar to the threshold voltage of the PFETs 316 and 318, when the PFET stack 306 turns on.

Similarly, at the NFET stack 302, the gate-to-source voltage Vgs can be higher than the NFET stack threshold voltage. The source of the NFET stack 302 (i.e., the source of NFET 310) is connected to a ground terminal, and operates as a current source. When the gate voltage of the NFET stack 302 crosses the threshold voltage (relative to ground) of the NFETs 310 and 312, the NFET stack 302 is turned on and pulls the NFET branch node 324 low. When the NFET branch node 324 is low and the PFET branch node 326 is high: (a) the voltage supply is greater than the PFET and the NFET stack thresholds; (b) both inputs of the AND gate 332 are high; and (c) accordingly, the POR signal is also high.

Although the NFET stack 302 and the PFET stack 306 include their respective pairs of stacked transistors in series, a greater number of transistors than two can also be stacked. This is one way to achieve a same function as long length transistors for the POR circuit to operate in a nanoamp range, because threshold voltage in nanoamp operation can depend on length. Accordingly, the POR circuit 104 (e.g., 300) can use a minimum possible transistor length for a digital circuit. Alternatively or additionally, a minimum length transistor can be used together with a long length transistor in the respective stacks 302 and 306. Stacking the transistors at each branch can ensure that every threshold dependence of the transistors is captured.

The advantages of the POR circuit 300 configuration of the POR circuit 104 is that the circuit is fast, because it is self-starting, and the trip point is dependent on the weaker of the two transistors or transistor branches. When both of the scenarios are satisfied effectively, and the maximum threshold voltage of the two branches is satisfied, the output signal is provided at the POR output.

The two nodes 324 and 326 operate as analog nodes, and a digital ANDing of the POR circuit 300 is configured. However, the nodes can move slower, and a digital gate could misbehave as a result.

Figure 4:
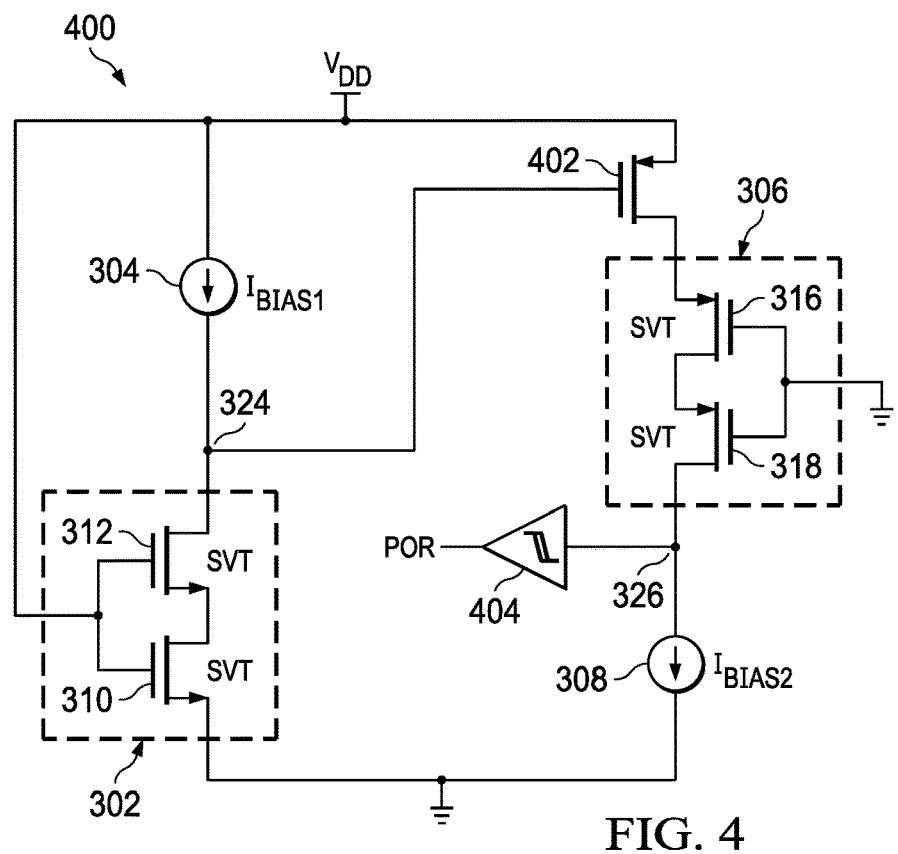
FIG. 4 is another example circuit configuration of the POR device according to various aspects of this description.

FIG. 4 is another example configuration of the POR device 104, including CMOS circuitry that is similar in some aspects to the POR circuitry 300 of FIG. 3. The NFET branch node 324 is connected to the gate of another PFET 402 of the PFET branch. The PFET 402 can operate as a PFET switch connections to node 324. This enables an analog type of ANDing. Accordingly, when the node 324 has a logic low state, the gate of this PFET 402 has the ground voltage. When the VDD crosses the threshold voltage (relative to node 324) of this PFET 402 and the threshold voltage (relative to ground) of the full PFET stack 306, the node 326 has a high logic state, so a high logic state POR signal is provided by the comparator 404 as a Schmitt trigger at the POR output thereof.

Figure 5:
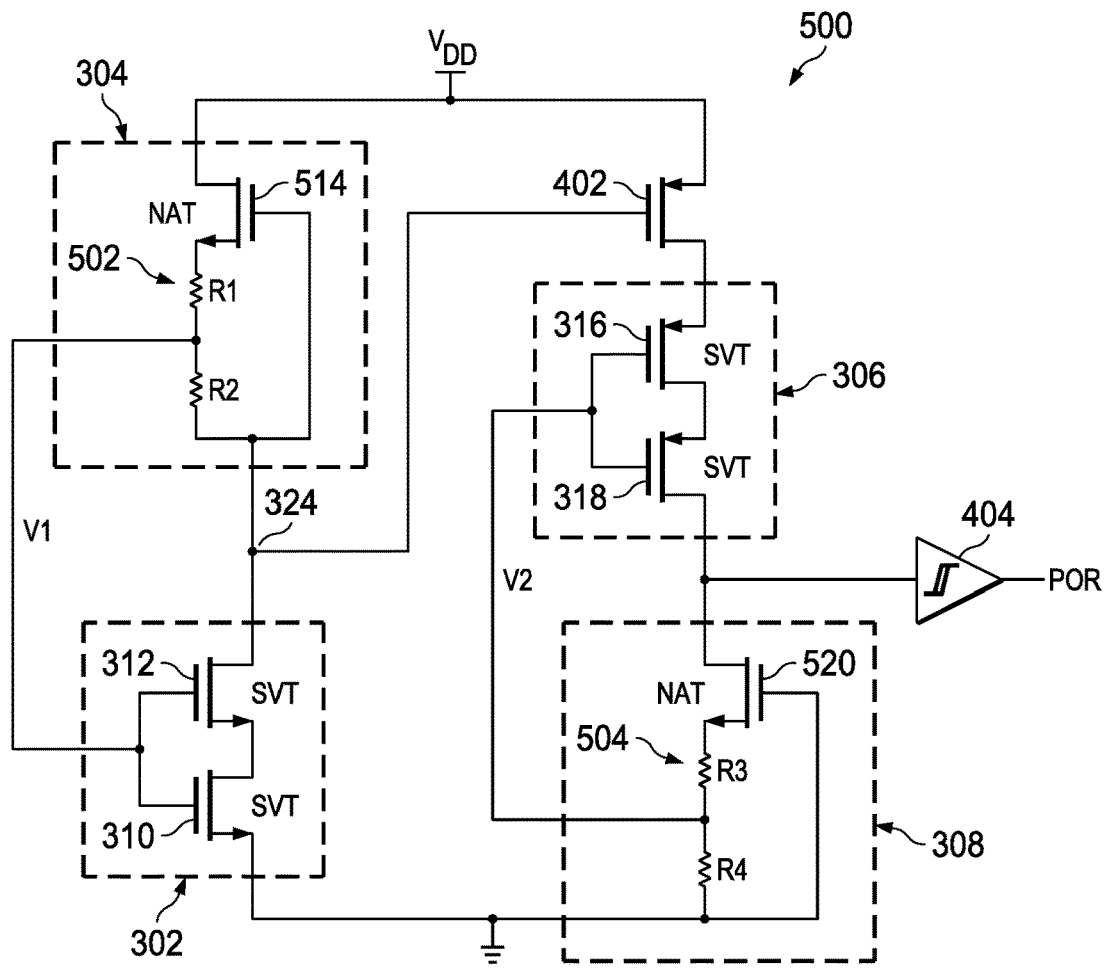
FIG. 5 is another example circuit configuration of the POR device according to various aspects of this description.

FIG. 5 is yet another example configuration of the POR device 104, including CMOS circuitry that is similar in some aspects to the POR circuitry 300 of FIG. 3 and POR circuitry of FIG. 4.

The current source 304 can include a first self-starting degenerated natural (NAT) NFET or a depletion mode NFET 514. The source of the NFET 514 is connected to a resistor component 502, which includes resistors R1 and R2 forming a voltage/resistor divider at a node therebetween with V1. The current source 308 can include a second self-starting degenerated NAT NFET or a depletion mode NFET 520. The source of the NFET 520 is coupled to a resistor component 504, which is configured as a resistor divider or voltage divider at a node therebetween with V2.

Alternatively or additionally, the current source 304, the current source 308 or both may include any one of the example current sources 350 (shown in FIG. 3 as 340, 342 or 344, for example). In at least one example, the current source 304 includes the voltage or resistor divider 502 (e.g., R1 and R2 in series with a midpoint node connected to the gate of NFET stack 302 for generating a gate voltage V1). Similarly, the current source 308 can include the voltage or resistor divider 504 (e.g., R3 and R4 in series with a midpoint node connected to the gate of PFET stack 306 for generating a gate voltage V2).

The bias current sources 304 and 308 can include a degenerated NAT NFET or a depletion mode NFET 514 and 520, respectively, in which each has a negative threshold voltage. Accordingly, even when the gate and source voltages Vgs of the transistors 514 and 520 are zero, they can be operating and powered on. These transistors 514 and 520 can operate with a self-starting bias current that does not use any start-up circuitry to be on. For example, the bias current sources 304 and 308 can operate in a subthreshold region to achieve nanoamp bias, which can be adjustable by adjusting their respective resistor components 502 or 504.

As shown in FIG. 5, instead of connecting the gate of the PFET stack 306 (PFETs 316 and 318) directly to the ground terminal, and the gate of the NFET stack 302 (NFETs 310 and 312) directly to the voltage supply terminal VDD, those gates are connected to a reduced voltage by resistor dividers 504 and 502, respectively. Accordingly, V1 of the gate of the NFET stack 302 (NFETs 310 and 312) is configured to have a voltage of VDD minus a voltage X, where X is a function of the overdrive voltage Vgs of transistor 514 and the resistor divider 502, or Vgs multiplied by R1/(R1+R2). When VDD minus X crosses the threshold voltage of the NFET stack 302 (NFETs 310 and 312), only then will the NFET stack 302 (NFETs 310 and 312) turn on. Accordingly, when VDD is greater than threshold voltage of the NFET stack 302 plus X, the NFET stack 302 will turn on, and the plus X is an additional margin for the threshold voltage of the NFET stack 302. The voltage V1 can be approximately equal to VDD minus the Vgs of the degenerated NAT NFET 514 applied to the resistor divider 502 (resistors R1 and R2). The voltage V1 can be represented as: V1≈VDD−|Vgsnat|*(R1/(R1+R2).

Similarly, the gate of the PFET stack 306 (gates of transistors 316 and 318) is connected to the voltage or resistor divider 504, as formed by R3 and R4. V2 can be equal to the Vgs of the degenerated NAT NFET 520 applied to the resistor divider 504 (resistors R3 and R4). The voltage V2 can be represented as: V2≈|Vgsnat|*(R4/(R3+R4).

V1 and V2 can be the added voltage margins that affect the trip point variation. Thus, when VDD is greater than the maximum of V1 plus a voltage margin (which is the NFET stack 302 threshold voltage plus Vgsnat applied to R1 by 1/R1+R2), or when VDD is greater than the PFET stack 306 threshold voltage plus a voltage margin, then will the POR output signal be high. Although the current is lower in a nanoamp range, the transistor gates of the PFET and NFET stacks 306 and 302 can also be weaker. Accordingly, for example, the transistors do not necessarily require a long length to have a same or similar trip point, so Vtrip≥maximum threshold voltage (VTH_NFET, VTH_PFET)+ Vmargin, where VTH_NFET and VTH_PFET are the threshold voltages for the NFET stack and the PFET stack, respectively.

In an aspect, the POR circuit 300 can generate an additional voltage margin, so the trip point variation or trip point delay can be varied or altered as a function of the threshold voltage of the NFET stack 302 or the PFET stack 306, and the additional voltage margin(s). The degenerated NAT transistors 514 or 520 can also be configured as depletion mode transistors that have a negative (or around zero) threshold voltage. Thus, if the NAT transistors 514 or 520 are strong, then a higher V1 and V2 can result, effectively providing a higher voltage margin from the CMOS circuitry of the POR device 500 for example. Or if the transistor(s) 514 or 520 are weak, then the modulus of the Vgs can also be lowered, resulting in a lower voltage margin at that process corner.

In an example, if the NFET branch 302, 304 has a slow process corner, and the PFET branch 306, 308 has a fast process corner, then the voltage margin can be less, so the trip point would be much less and not necessarily optimal (less than what is required). However, the POR device 500 could work very well at the other extreme, in which the PFET branch 306, 308 is slow, so the threshold voltage of transistor 520 (V2) is higher. If the NFET branch 302, 304 is strong and V2 is also higher, then an optimal or good trip point could be achieved with a slow PFET branch 306, 308 process corner and a fast NFET branch 302, 304 process corner. Accordingly, if the voltage margin is also high, then the threshold voltage can be high, thereby achieving a more optimal trip point variation or trip point delay. But if the NFET branch 302, 304 is slow, then the voltage margin can be lower, thereby giving a lower trip point, which is not necessarily always desired. Thus, the voltage margins added to Vth can be a fraction of an absolute value of Vgsnat or |Vgsnat|. An optimal trip point can be at a skew PN corner, and a low margin at a weak skew NP corner.

Figure 6:
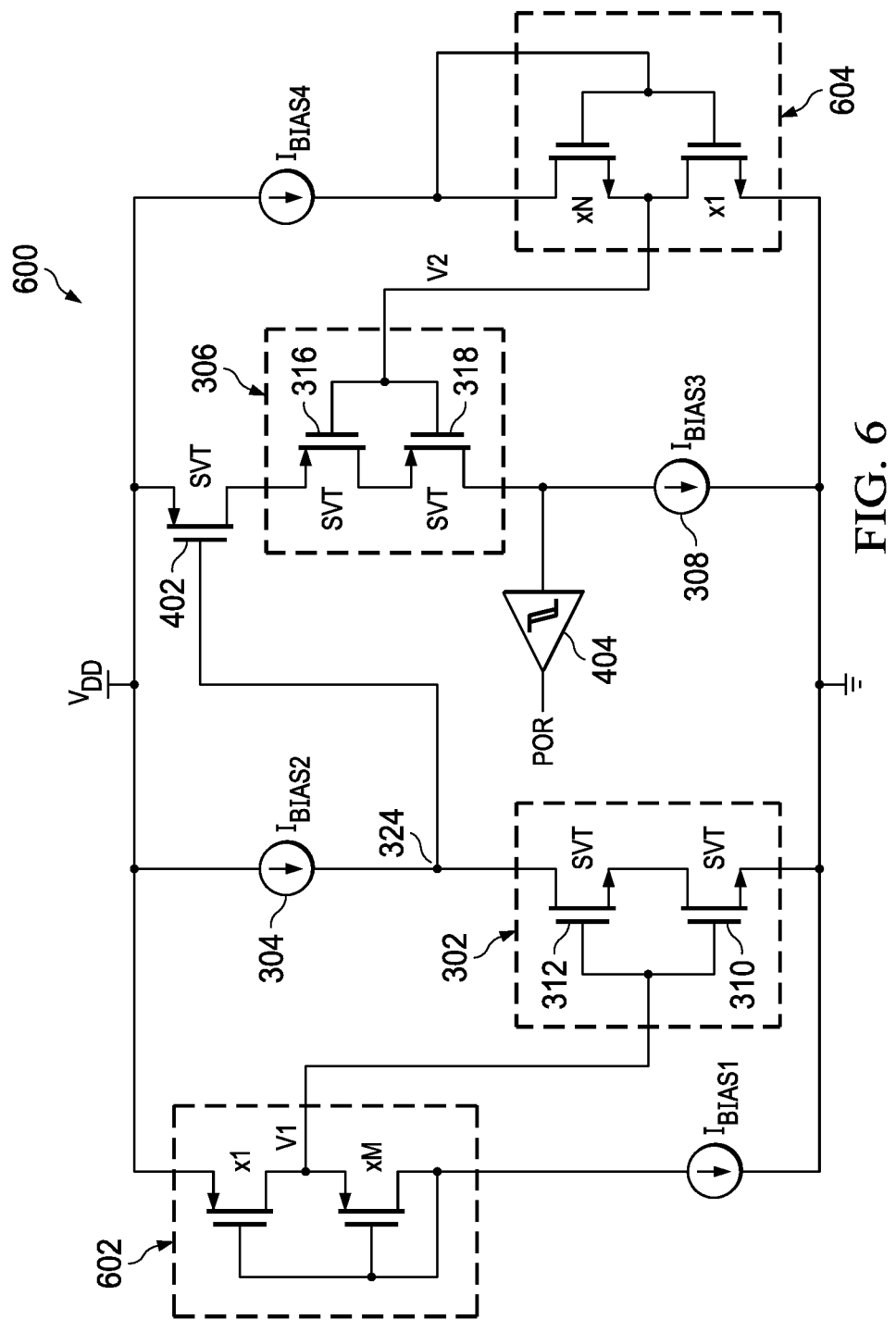
FIG. 6 is another example circuit configuration of the POR device according to various aspects of this description.

FIG. 6 is a further example configuration of the POR device 104, including CMOS circuitry that is similar in some aspects to the POR circuitry 300, 400, and 500 of FIGS. 3 through 5. In the configuration of the POR CMOS circuitry 600, current bias arms 602 and 604 are further coupled to the NFET branch and PFET branch. The current bias arm 602 is connected to the supply terminal VDD and to the ground terminal, thereby forming a first bias current (Ibias1). A V1 node provides V1 between a transistor x1 and transistor xM of current bias arm 602, coupled to the NFET stack gate of NFETs 310 and 312. The current bias arm 604 is likewise coupled to the NFET and PFET branch at VDD and ground forming a second bias current (Ibias4). A V2 node forms V2 between a transistor x1 and xN of current bias arm 604, coupled to the PFET stack gate of PFETs 316 and 318. The gates of the current bias arm 602 is further connected to the ground terminal, while the gate of the current bias arm 604 transistors is further coupled to VDD.

When the PFET branch is low, the voltage margin can be good. But when the NFET branch is low, the voltage margin is not necessarily optimal. Thus, the current bias arm 602 can include at least two PFETs x1 and xM, which can be a same type. Additionally or alternatively, their dimensions (e.g., length (L) and width (w) of the gate) can be different. Accordingly, the voltage V1 may be equal to VDD minus a thermal voltage dependent on a temperature (Vt) into a natural log of the ratio between the dimensions of PFETs x1 and xM. Thus, even if the transistors have different margins, a same current can flow through them. The ratio between the dimensions of the two PFETs x1 and xM can be represented as M, so V1=VDD−Vt*ln(M), where Vt (i.e., thermal voltage) is k*T/q, k is the Boltzman constant, T is an absolute temperature, and q is a charge of an electron. This representative equation can be based on the transistors being in the subthreshold and represented with a thermal voltage (Vt) into M with a ratio between the same types of transistors x1 and xM. Thus, the CMOS circuitry of the POR device 600 can be configured to ensure that the voltage margins are not dependent on the threshold voltage, so the circuit can operate in a strong and fast corner or in the slow corner, and the margins are not affected.

A similar equation can represent V2 as a natural log of a ratio of the dimensions of transistors xN and x1 of the current bias arm 604, represented as V2=Vt*ln(N), so v2 at the PFET stack 306 gate and the current bias arm 604 can be a thermal voltage by a natural log of the ratio of the dimensions between transistors xN and x1 of the current bias arm 604, in which, similar to M.

In an aspect, the voltage margin does not have a threshold voltage dependence, but it can depend on temperature, and the transistors of the current bias arms 602 and 604 can directly vary with a temperature. If the device 600 operates at a high temperature, then the voltage margin will be high. Or if the device 600 operates at a low temperature, then the voltage margin will be low. The circuit can thus be symmetrical with respect to the two current bias arms. Adjusting the voltage margins can be configured by adjusting the dimensions of these transistors x1 and xM and x1 and xN, for example. Further, the margin does not depend on the process corner (e.g., slow or fast) in which it is operating. The voltage margins can be added to Vth as multiples of the thermal voltage.

Figure 7:
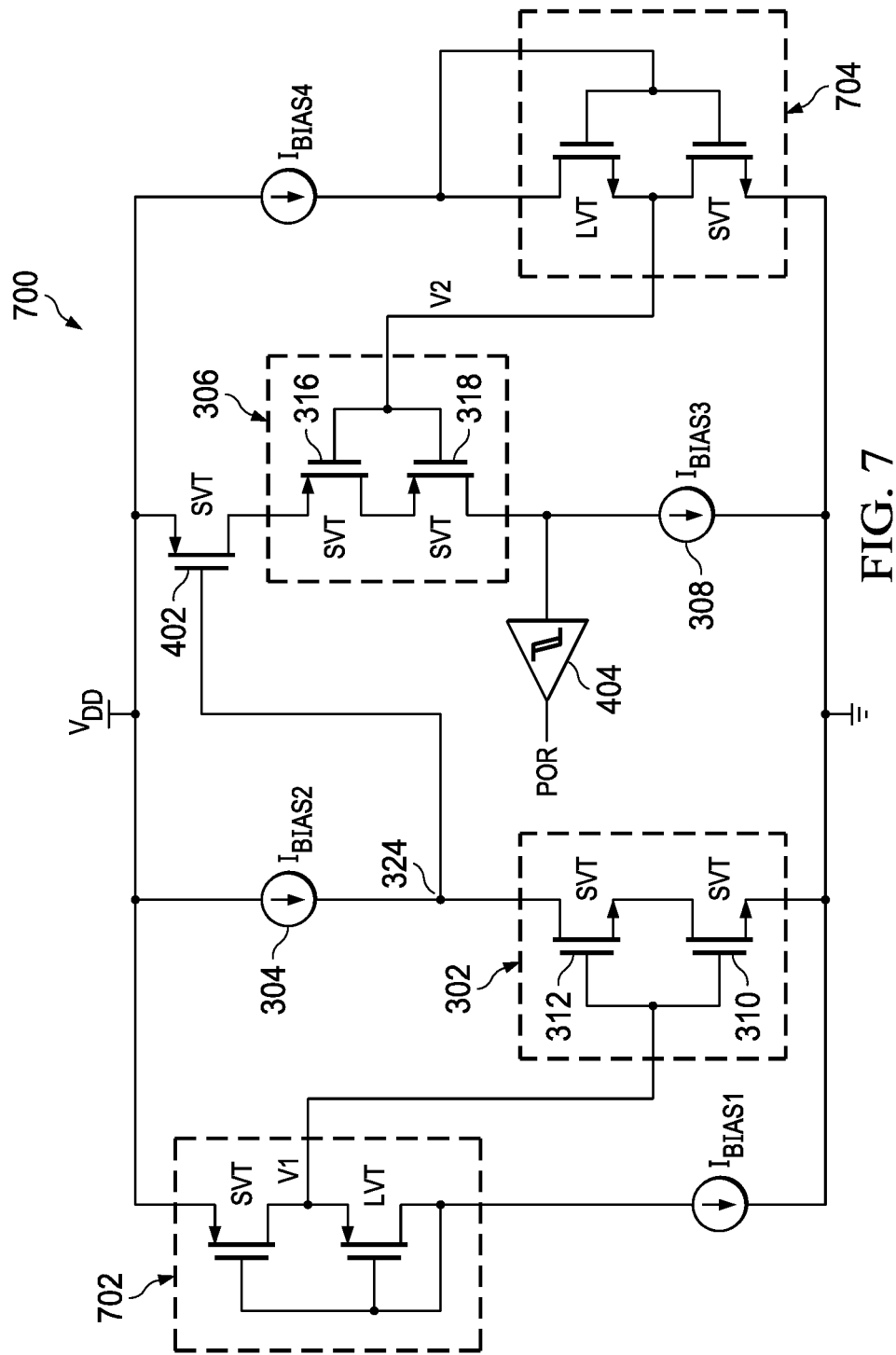
FIG. 7 is another example circuit configuration of the POR device according to various aspects of this description.

FIG. 7 is another example configuration of the POR device 104, including CMOS circuitry that is similar in some aspects to the POR circuitry 300, 400, 500 and 600 of FIGS. 3 through 6. In the configuration of the POR CMOS circuitry 700, the transistors of each current bias arm 602 and 604 can be different types of transistors (e.g., standard voltage threshold (SVT) and low voltage threshold (LVT) transistors) as the current bias arms 702 and 704. Further, the transistors of the current bias arm 702 can include PFETs, while the transistors of the current bias arm 704 can include NFETs; in other embodiments, these transistors could be the same type as also in FIG. 6.

In an aspect, the transistors of each current bias arm 702 and 704 can be a same oxide type, but with different threshold voltages. For example, one transistor can be a standard threshold voltage transistor, while the other transistor can be a low threshold voltage transistor. The standard threshold voltage (SVT) transistor can have a higher threshold voltage than the low threshold voltage (LVT) transistor.

The transistors of current bias arms 702 and 704 can have a same oxide, and can share many fabrication steps. For example, if the SVT is fabricated in a fast process corner, then the LVT will also be in the fast corner, and the differences between those transistors would be the same. Likewise, if both of those transistors are fabricated in a slow process corner, then their differences would be the same. Because both of those transistors vary in a same direction, the difference (delta term) between those transistors (i.e., VthSVTp−VthLVTp and VthSVTn−VthLVTn) can be configured to be almost constant.

V1 can be equal to VDD minus the difference (delta term) between the two transistors (SVT and LVT) of the current bias arm 702, minus the thermal voltage multiplied by a natural log of a temperature correction term. The delta term can be the threshold voltage of the SVT minus the threshold voltage of the LVT. Thus, V1 can be VDD minus the delta term of the transistors of current bias arm 702, so V1=VDD−(VthSVTp−VthLVTp).

Also, the POR device 700 can be configured with a temperature correction term of $$\frac{\beta_{effLVTp}}{\beta_{effSVTp}},$$

where Beff is a temperature coefficient term with respect to the LVTpfet transistor or the SVTpfet transistor, respectively. Because Ibiases are both in a nanoamp range, as the transistors SVT and LVT are in a subthreshold region, V1 can be represented as:

$$V1 = VDD - (VthSVTp - VthLVTp) - Vt*\ln\left(\frac{\beta_{effLVTp}}{\beta_{effSVTp}}\right).$$

Thus, V1 is dependent on the thermal voltage Vt multiplied by the ratio of the dimensions of those two transistors of the current bias arm 702. In FIG. 6, the M term must also be always greater than one to ensure optimal function of the circuit. But in the CMOS circuitry of the POR device 700, the two different threshold voltage transistors enable this ratio to be greater than one, or be equal to one, or also be less than one. Accordingly, if the ratio is greater than one, then a negative coefficient for the threshold voltage is achieved. Likewise, if the ratio is less than one, then this temperature term is negative. Overall, it would become positive, so basically the POR device 700 includes a temperature control over the trip point variation or trip point delay, along with the delta term that is configured to be constant over different process corners.

Similarly, for the current bias arm 704 with NFET SVT and LVT transistors, V2 can be a margin on the other side, so V1 and V2 are the added voltage margins that affect the trip point variation. Thus, a threshold difference can be configured between two NFETs of the current bias arm 604, plus a temperature correction term of $$\frac{\beta_{effLVTn}}{\beta_{effSVTn}},$$

where Beff is a temperature coefficient term with respect to the LVTnfet transistor or the SVTnfet transistor, respectively. V2 (as a second voltage margin) can be represented as:

$$V2 = (VthnSVT - VthnLVT) + Vt*\ln\left(\frac{\beta_{effLVTn}}{\beta_{effSVTn}}\right),$$

where Vt (i.e., thermal voltage) is k*T/q. Accordingly, the voltage margins of V1 and V2 can be fairly constant as addends to both the NFET and PFET branches over process, voltage and temperature tolerances (or fabricated PVT process tolerances), as different from (or additional to) the threshold voltages of the CMOS circuitry's NFET and PFET branches.

Figure 8:
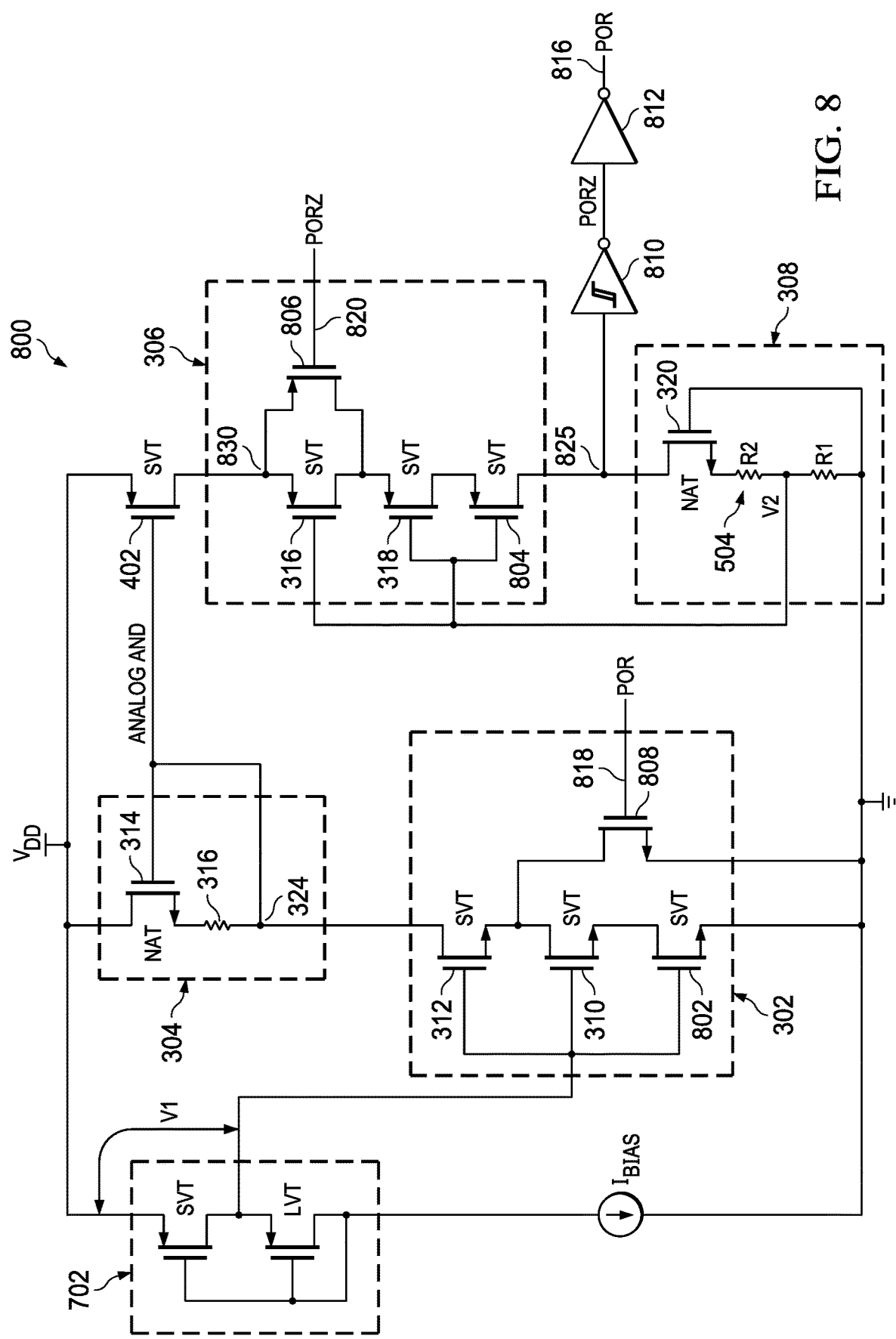
FIG. 8 is another example circuit configuration of the POR device according to various aspects of this description.

FIG. 8 is yet another example configuration of the POR device 104, including CMOS circuitry that is similar in some aspects to the POR circuitry 300 through 700 of FIGS. 3 through 7. In the configuration of the POR CMOS circuitry 800, only one current bias arm 702 is coupled to the NFET and PFET branches with Ibias. Further, the current divider 504 of FIG. 5 is configured at the current source 308 as a NAT transistor arrangement.

As shown in FIG. 8, the NFET stack 302 can include one or more additional NFETs 802. Further, the PFET stack 306 can include one or more additional PFETs 804. Moreover, the NFET stack 302 can include another NFET 808 coupled in parallel to at least a portion of the NFETs (e.g., 310, 802) of the NFET stack 302, thereby forming a POR output 818 at the gate of the NFET 808. Similarly, the PFET stack 306 can include another PFET 806 coupled in parallel to at least a portion of the PFETs (e.g., 316) of the PFET stack 306, thereby forming an inverted PORZ output 820 at the gate of the PFET 806. In this example, a third output terminal 816 provides another POR signal responsive to inverting buffers 810 and 812.

The NAT transistor arrangement in current source 308 can be configured particularly for the margin of the NFET stack 302, and for the PFET stack 306, where a modulus of the NAT transistor(s) in current source 308 modified by R1/R1+R2 is sufficient for V2. Thus, if the PFET is operational at a slow corner, and if the NFET is operational at a fast corner, then the trip point variant can be optimal. The threshold voltage can also be high, and the trip point can still be optimal, based on many of the advantages of the embodiments in examples and other drawings herein. With bias currents operating in a nanoamp range, and the transistors being in a subthreshold region, V1 and V2 can be represented as:

$$V1 = (VthSVTp - VthLVTp) + Vt * \ln\left(\frac{\beta\mathit{eff}LVTp}{\beta\mathit{eff}SVTp}\right);$$

$$V2 \approx |Vgsnat| * \frac{R_1}{R_1 + R_2};$$

and Vt=k*T/q as the thermal voltage. Various different transistor combinations with one transistor |Vth| higher than the other(s) are envisioned. For PMOS or PFETs a modulus can be utilized in the representation since Vth can be negative, and a an absolute or a modulus of the PFET Vth (Vthp) can be calculated.

In an aspect, the trip point equation can be represented as: VDDtrip≈max[(VthnSVT+V1), (VthpSVT+V2)], where V1 and V2 express a tunable voltage margin according to various aspects or embodiments herein. Accordingly, a constant and sufficient voltage margin that is tunable can be added, which accounts for a trip point in a weak and skew NP corner. A factor of |Vgsnat| is added to the PFET branch, so that factor can optimally configure the trip point in the skew PN corner.

When the input (VDD) is applied to the POR circuit 800, the self-starting degenerated natural (NAT) NFET 314 in current source 304 pulls the node 324 toward the supply voltage VDD, and a similar natural (NAT) NFET 320 in current source 308 pulls a node 825 toward ground. Subsequently, a voltage of VDD-V1 develops at the gate of the NFET stack 302, and the voltage V2 develops at the gate of the PFET stack 306. The currents in all the circuit arms have a nA magnitude and are ~|VthNAT|/R. Because the currents have a nA magnitude, the transistors are in subthreshold region, so approximately an overdrive of the threshold voltage is enough to turn the transistor on.

Accordingly, if VDD-V1 is higher than the threshold voltage of all transistors in the NFET stack 302, then: (a) the NFET stack 302 pulls the node 324 to the ground voltage; and (b) the PFET 402 (with gate connected to node 324) is turned on, so the PFET 402 pulls the node 830 to the supply voltage at VDD. If VDD-V2 is greater than the threshold voltage of all transistors in the PFET stack 306, then the PFET stack 306 pulls the node 825 to the supply voltage at VDD, so the PORZ signal (provided by the inverting buffer 810) has a logic low state, and the POR signal (provided by the inverting buffer 812) has a logic high state. These signals can then be used to bypass some of the transistors in the stack for hysteresis.

As described above, the trip point is a function of maximum threshold voltages of NFETs and PFETs with desired margins (V1, V2). Those desired margins are generated using nA bias, without negatively impacting area and speed. Because a degree of freedom exists to adjust the trip point, the POR circuits herein are suitable for operating at nA Iq without requiring the transistors to have huge lengths, thereby saving area and reducing delays. Within the NFETs and PFETs themselves, different dimensions may have different threshold voltages. Also, a stack of transistors (instead of a single transistor) helps to accommodate the dimension-related threshold constraints as well as different types of transistors.

The margin V1 for the NFET branch is dependent on the difference (delta term) between two correlated transistors, so it is fairly accurate over process corners. Accordingly, NFET-dependent trip points (when NFET is weak) can be covered well by this branch. The margin V2 for the PFET branch is derived from the NFET |VTHNNAT|, which is highest when the NFET is strong, so slow PFET and fast NFETs are covered nicely. Along with the delta term, a temperature correction term allows for adjustment of both nature and value of the temperature coefficient of the trip point. This adjustment can be made by adjusting the beta terms for the transistors, such as by adjusting their respective W/L ratios.

In various aspects, the POR circuit 104 can achieve an optimum VDDmin for a desired performance of CMOS digital logic. The POR devices herein can ensure that the POR trip point is a maximum of the NFET and PFET Vth, thereby handling skewed corners for POR output. Because the POR devices herein allow setting of the desired margins with respect to the threshold voltage, the trip point can be tuned according to a frequency of operation requirement, without affecting the power and area (Ibias or transistor length). The temperature behavior of the trip point (at about the voltage margin) can be tuned as desired (CTAT, PTAT or ZTC) by adjusting the transistor ratios. The example embodiments do not require very high transistor lengths while operating at nA bias to extract the Vth (subthreshold region), because they have an extra degree of freedom (the gate voltage) to compensate for a negative overdrive Vgst.

Figure 9:
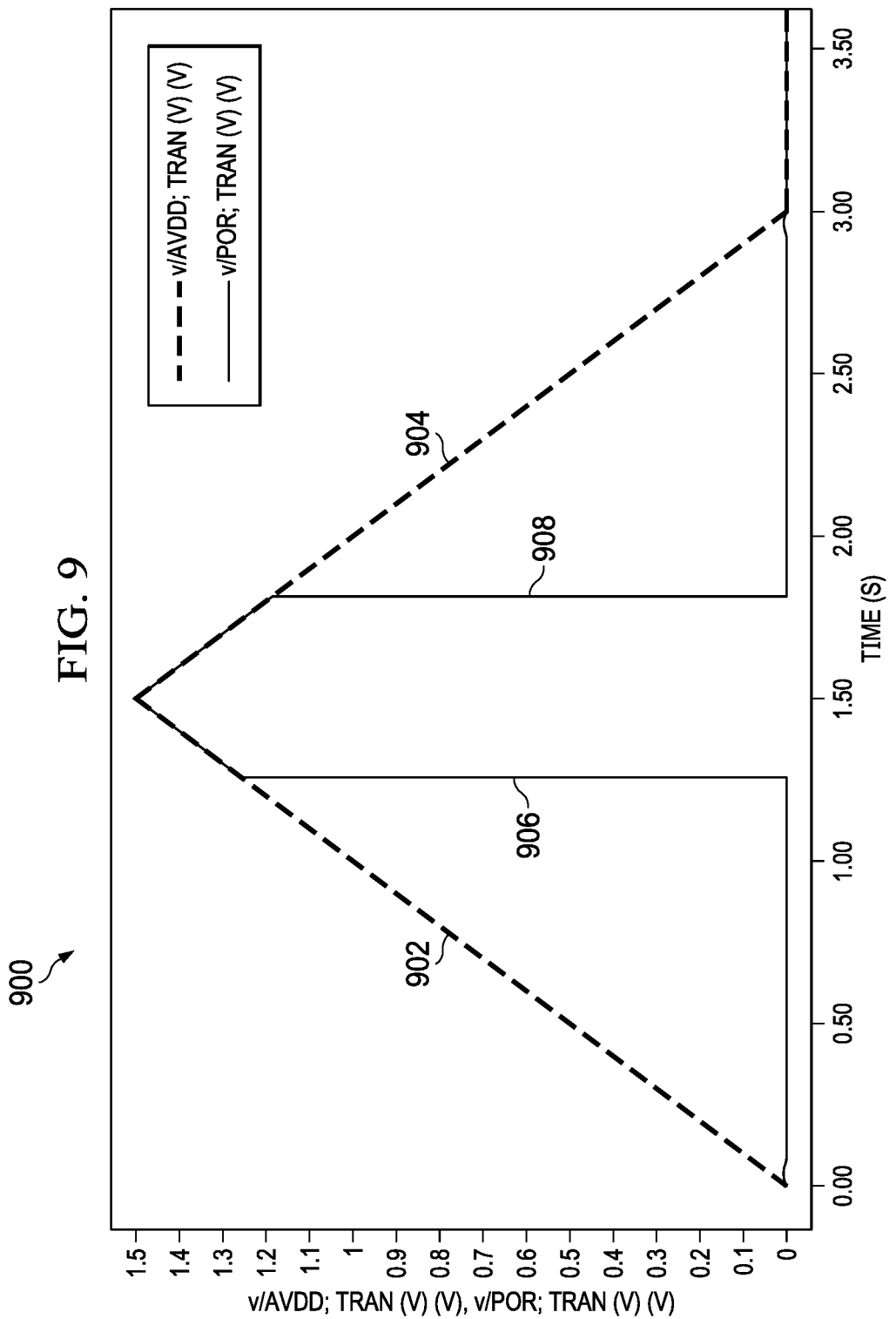
FIG. 9 is a working waveform of a POR circuit of the POR device according to various aspects of this description.

FIG. 9 is an example working waveform 900 according to various aspects. The working waveform 900 can be in seconds to microseconds, and shows where the POR output 906 is tripping to provide an output as the VDD is ramping up at 902. The supply terminal VDD is ramping up at 902 and ramping down at 904, while the output of the POR is going high at 906 and low at 908.

Figure 10:
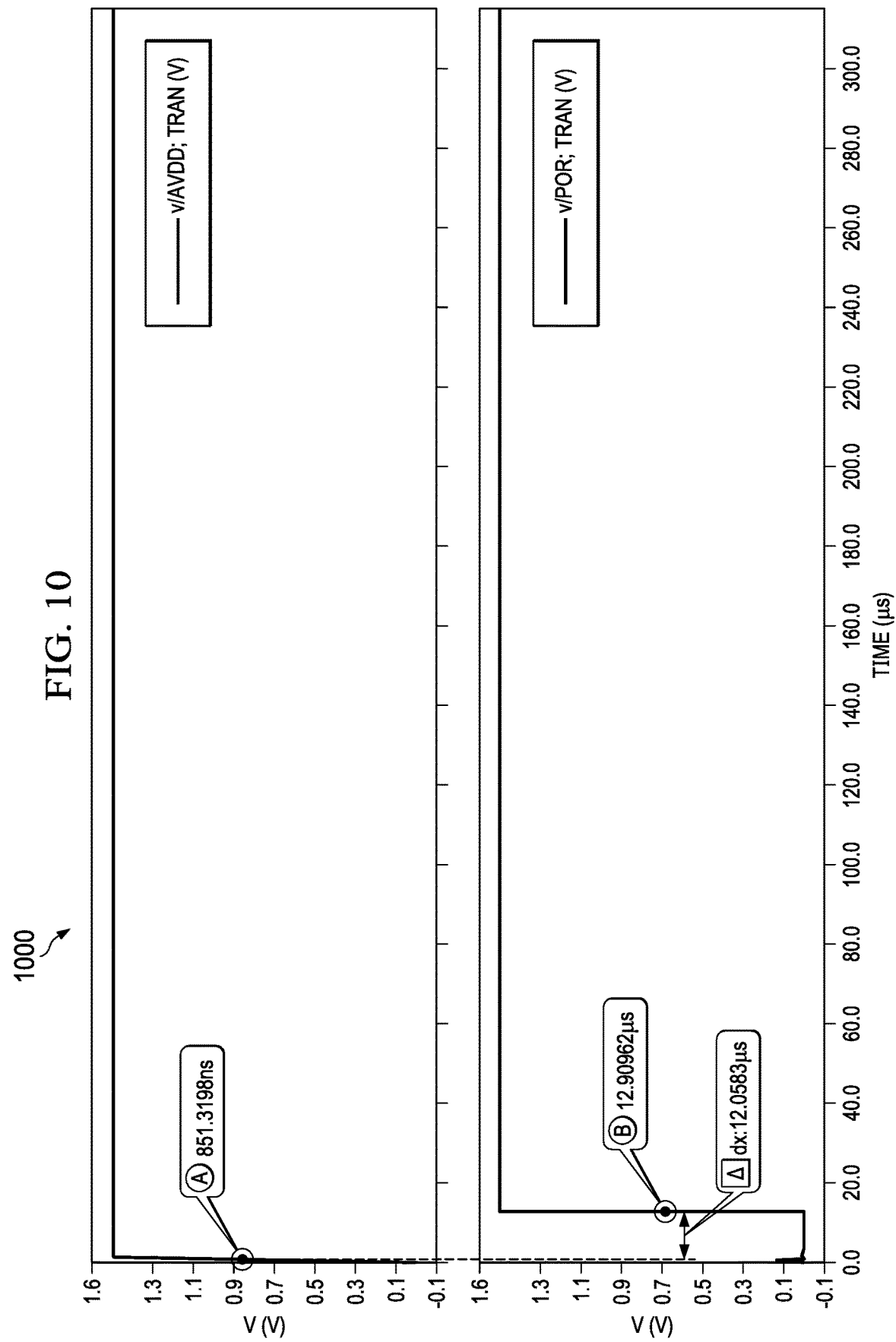
FIG. 10 is a timing waveform of a POR circuit of the POR device according to various aspects of this description.

FIG. 10 demonstrates example timing waveforms 1100. The top portion is an example timing of the analog VDD of the POR circuit 104. The bottom portion is an example timing waveform of the POR output of the POR circuit 104. In this example, the POR trip delay is shown as about 12.0583 microseconds.

Figure 11:
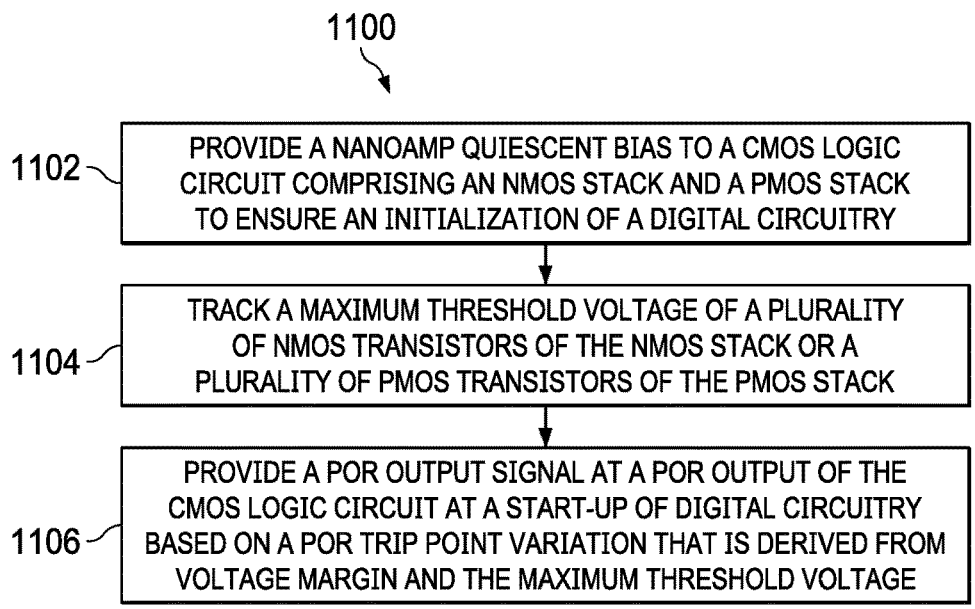
FIG. 11 is a flow chart of a method performed by a POR circuit of the POR device according to various aspects of this description.

FIG. 11 is a flow chart of an example method 1100 to convert an input signal from an input node into an output signal at an output node. The method 1100 may be performed by any of the POR circuits described herein, such as the POR device 104. A controller (e.g., 108) can also be configured to control the various components of the POR devices. The controller may be implemented as a processor or machine executing stored computer-executable instructions, hardware, firmware, and so on, for example.

The method 1100 includes, at 1102, providing a nanoamp quiescent bias to a CMOS logic circuit (including an NFET stack and a PFET stack of the POR device) to ensure an initialization of digital circuitry therein. At 1104, the POR device can track a maximum threshold voltage of NFETs of the NFET stack or PFETs of the PFET stack. At 1106, a POR output signal can be provided at a POR output of the CMOS logic circuit at a start-up of the digital circuitry, based on a POR trip point variation derived from a voltage margin and the maximum threshold voltage. The voltage margin can be based on at least one of: a temperature variable, a frequency of operation, or an overdrive voltage, for example.

The method 1100 can further include providing the voltage margin to alter the POR trip variation and decrease a trip point delay of the CMOS logic circuit via: a first degenerated natural (NAT) NFET arrangement or a first depletion mode NFET arrangement coupled to the NFET stack; and a second degenerated NAT NFET arrangement or a second depletion mode NFET arrangement coupled to the PFET stack. The voltage margin can be provided according to a difference (delta term) between threshold voltages of a current bias arm's transistors to provide a trip point voltage margin according to a temperature factor.

The methods are illustrated and described above as a series of acts or events, but the illustrated ordering of such acts or events is not limiting. For example, some acts or events may occur in different orders and/or concurrently with other acts or events apart from those illustrated and/or described herein. Also, some illustrated acts or events are optional to implement one or more aspects or embodiments of this description. Further, one or more of the acts or events depicted herein may be performed in one or more separate acts and/or phases. In some embodiments, the methods described above may be implemented in a computer readable medium using instructions stored in a memory.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

Modifications are possible in the described examples, and other implementations are possible, within the scope of the claims.

What is claimed is:

1. A power-on-reset (POR) circuit, comprising:
   an NFET branch comprising: an n-channel field effect transistor (NFET) having a first threshold voltage; and a first quiescent bias current source coupled between a supply terminal and the NFET;
   a PFET branch comprising: a p-channel field effect transistor (PFET) having a second threshold voltage; and a second quiescent bias current source coupled between a ground terminal and the PFET; and
   the POR circuit configured to provide a POR signal at an output terminal based on: the first threshold voltage or the second threshold voltage, whichever is larger; and a voltage margin;
   in which the output terminal is coupled between the PFET branch and the second quiescent bias current source.

2. The POR circuit of claim 1, wherein the voltage margin is tunable based on at least one of: a temperature variable; a frequency of operation; or an overdrive voltage (Vgs-Vth) of the NFET branch or the PFET branch.

3. The POR circuit of claim 1, further comprising a switch coupled to the NFET branch and the PFET branch, the switch configured to: provide the POR signal; or couple the PFET branch to a ground terminal responsive to the supply terminal having the second threshold voltage.

4. The POR circuit of claim 1, wherein the NFET branch comprises a first degenerated transistor arrangement coupled to the NFET, and the PFET branch comprises a second degenerated transistor arrangement coupled to the PFET, and the first degenerated transistor arrangement and the second degenerated transistor arrangement have negative threshold voltages and are configured to vary a nanoamp quiescent bias.

5. The POR circuit of claim 4, further comprising first and second resistors, wherein: the first degenerated transistor arrangement comprises an NFET transistor coupled to the first resistor and the NFET branch; the second degenerated transistor arrangement comprises a PFET transistor coupled to the second resistor and the PFET branch; the first resistor is part of a first resistor divider configured to alter a POR trip point variation of the POR signal at the output terminal; and the second resistor is part of a second resistor divider configured to decrease a trip point delay of the POR signal at the output terminal.

6. The POR circuit of claim 1, wherein the NFET branch comprises a stack of NFET transistors having an NFET gate, and the POR circuit further comprises transistors coupled to the NFET gate and configured to provide a trip point voltage margin that varies according to a temperature as a part of the voltage margin.

7. The POR circuit of claim 6, wherein the PFET branch comprises a stack of PFET transistors having a PFET gate, and the POR circuit further comprises transistors coupled to the PFET gate and configured to provide another trip point voltage margin that varies according to the temperature as another part of the voltage margin, wherein at least one of: the stack of PFET transistors, or the stack of NFET transistors comprise transistors of different types of PFETs, or NFETs, respectively, that comprise different dimensions.

8. The POR circuit of claim 6, wherein the transistors coupled to the NFET gate comprise: a first transistor having a first threshold voltage; and a second transistor having a second threshold voltage below the first threshold voltage.

9. The POR circuit of claim 6, wherein the PFET branch comprises a stack of PFET transistors.

10. A power-on-reset (POR) circuit, comprising:
    an NFET stack comprising NFETs;
    a PFET stack coupled to the NFET stack, the PFET stack comprising PFETs;

a supply voltage input coupled to the NFET stack and the PFET stack, the POR circuit configured to provide a nanoamp quiescent bias at the supply voltage input; and a POR output terminal at which the POR circuit is configured to provide a POR output signal based on a POR trip point variation by tracking a maximum threshold voltage of the NFET stack or of the PFET stack, plus a voltage margin.

11. The POR circuit of claim 10, wherein the POR trip point variation comprises a POR trip delay that is less than 50 microseconds.

12. The POR circuit of claim 10, wherein the voltage margin is based on at least one of: a temperature variable, a frequency of operation, or an overdrive voltage of the NFET stack or of the PFET stack.

13. The POR circuit of claim 10, wherein the NFET stack has an NFET gate and an NFET drain, the PFET stack has a PFET gate and a PFET source, and the POR circuit further comprises:

first and second resistors;

a first self-starting degenerated natural (NAT) NFET transistor or a first depletion mode NFET transistor having a first gate, a first source and a first drain, the first source coupled to the first resistor, the first gate coupled to the NFET drain, and the first resistor coupled to the NFET drain; and a second self-starting degenerated NAT NFET transistor or a second depletion mode NFET transistor having a second gate, a second source and a second drain, the second source coupled to the second resistor, the second gate coupled to the second resistor and a ground terminal, and the second drain coupled to the PFET source;

in which the first resistor is part of a first resistor divider, the first resistor divider is coupled to the NFET gate, the second resistor is part of a second resistor divider, and the second resistor divider is coupled to the PFET gate.

14. The POR circuit of claim 13, wherein the PFET stack has a PFET drain, and the POR circuit further comprises:

a logic AND device coupled to the NFET drain and the PFET source, the logic AND device configured to provide the POR output signal at the POR output terminal; or a PFET switch coupled to the PFET drain and the supply voltage input, in which the PFET gate is coupled the NFET drain.

15. The POR circuit of claim 10, wherein the NFET stack has an NFET gate, and the POR circuit further comprises:

a current bias arm comprising transistors coupled to the NFET gate.

16. The POR circuit of claim 15, wherein transistors of the current bias arm comprise a first PFET transistor having a first threshold voltage and a second PFET transistor having a second threshold voltage below the first threshold voltage.

17. The POR circuit of claim 16, wherein the PFET stack has a PFET gate, and the POR circuit further comprises:

a first degenerated NAT NFET transistor coupled to the NFET stack via a first resistor; and a second degenerated NAT NFET transistor coupled to the PFET stack via a second resistor;

in which the first degenerated NAT NFET transistor is configured to vary a nanoamp quiescent bias based on a variation of the first resistor, the second degenerated NAT NFET transistor is configured to vary the nanoamp quiescent bias based on a variation of the second resistor, and the second resistor is part of a resistor divider coupled to the PFET gate.

18. The POR circuit of claim 10, further comprising:

a PFET transistor coupled to at least one of the PFETs to provide a second POR output; and an NFET transistor coupled to at least one of the NFETs to provide a third POR output.

19. A method performed by a power-on-reset (POR) circuit controller, the method comprising:

providing a nanoamp quiescent bias to a CMOS logic circuit comprising an NFET stack and a PFET stack to ensure an initialization of digital circuitry;

tracking a maximum threshold voltage of: NFET transistors of the NFET stack; or PFET transistors of the PFET stack; and providing a POR output signal at a POR output of the CMOS logic circuit at a start-up of digital circuitry of the CMOS logic circuit based on a POR trip point variation derived from a voltage margin and the maximum threshold voltage, in which the voltage margin is based on at least one of: a temperature variable, a frequency of operation, or an overdrive voltage.

20. The method of claim 19, further comprising:

providing the voltage margin to alter the POR trip variation and decrease a trip point delay of the CMOS logic circuit via: a first degenerated natural (NAT) NFET transistor arrangement or a first depletion mode NFET transistor arrangement coupled to the NFET stack; and a second degenerated NAT NFET transistor arrangement or a second depletion mode NFET transistor arrangement coupled to the PFET stack; and providing the voltage margin according to a delta difference between threshold voltages of transistors of a current bias arm to provide a trip point voltage margin according to a temperature.

21. A power-on-reset (POR) circuit, comprising:

an NFET branch comprising: n-channel field effect transistors (NFETs) having a first threshold voltage; and a first quiescent bias current source coupled between a supply terminal and the NFETs;

a PFET branch comprising: p-channel field effect transistors (PFETs) having a second threshold voltage; and a second quiescent bias current source coupled between a ground terminal and the PFETs;

a first degenerated transistor arrangement coupled to the NFET branch and the supply terminal;

a second degenerated transistor arrangement coupled to the PFET branch and the ground terminal;

an output terminal at which the POR circuit is configured to provide a POR signal based on: at least one of the first threshold voltage or the second threshold voltage; and a voltage margin; and a current bias arm coupled to an NFET stack gate of the NFET branch to provide a trip point voltage margin as a part of the voltage margin.

22. The POR circuit of claim 21, wherein at least one of the first degenerated transistor arrangement or the second degenerated transistor arrangement comprises a resistor divider, and the first degenerated transistor arrangement and the second degenerated transistor arrangement have negative threshold voltages and are configured to vary a nanoamp quiescent bias based on a variation of the resistor divider.

23. The POR circuit of claim 21, further comprising a PFET switch coupled to a gate of the first degenerated transistor arrangement and coupled to the NFET branch between the first degenerated transistor arrangement and the NFETs.

* * * * *